June 27, 1961 R. CHAN 2,990,310

LAMINATED PRINTED CIRCUIT BOARD

Filed May 11, 1960 2 Sheets-Sheet 1

INVENTOR.
RICHARD CHAN.
BY Wallace P. Lamb
ATTORNEY.

June 27, 1961 R. CHAN 2,990,310

LAMINATED PRINTED CIRCUIT BOARD

Filed May 11, 1960 2 Sheets-Sheet 2

INVENTOR.
RICHARD CHAN.
BY Wallace P. Lamb
ATTORNEY.

United States Patent Office 2,990,310
Patented June 27, 1961

2,990,310

LAMINATED PRINTED CIRCUIT BOARD

Richard Chan, Highland Park, Mich., assignor to Burroughs Corporation, Detroit, Mich., a corporation of Michigan Filed May 11, 1960, Ser. No. 28,480
10 Claims. (Cl. 154—94)

This invention relates generally to a method of making electrical units and particularly to a method of making electrical circuits on laminated circuit boards.

It is an object of my invention to provide an improved method for the making of electrical circuits on a laminated dielectric board.

Another object of the invention is to provide an improved method of making electrical circuits on the opposite sides of and also between a pair of laminae in such manner as to insure a continuous plated through hole or holes in the laminae for good lectrical connections between the circuits.

Another object of the invention is to provide an improved method of making electrical units of the above mentioned character in which conducting bridges of tubular form are induced to build up during a plating operation by and integral with an intermediate circuit terminal land in the hole and other circuit terminals on the outer surfaces of the laminae.

Another object of the invention is to provide an improved electrical unit of the laminated printed circuit board type.

A further object of the invention resides in the provision of an inexpensive method of making plated through circuit boards.

Figure 1:
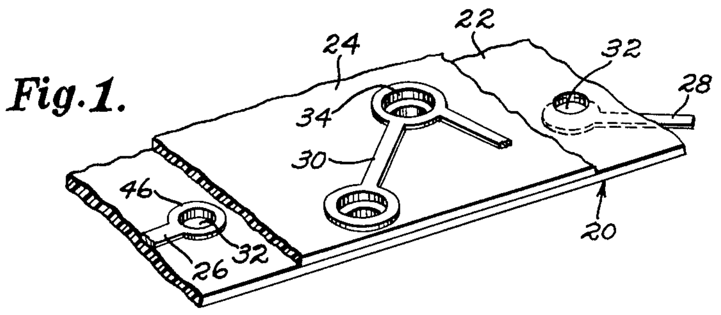
Figure 2:
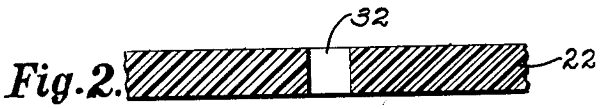
Figure 3:
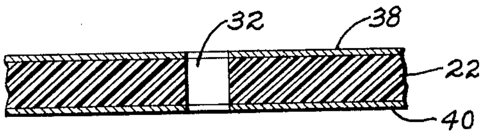
Figure 4:
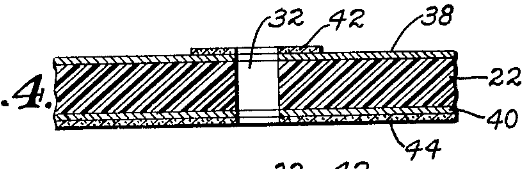
Figures 8, 9, 10, 11, 12, 13, 14, 15:
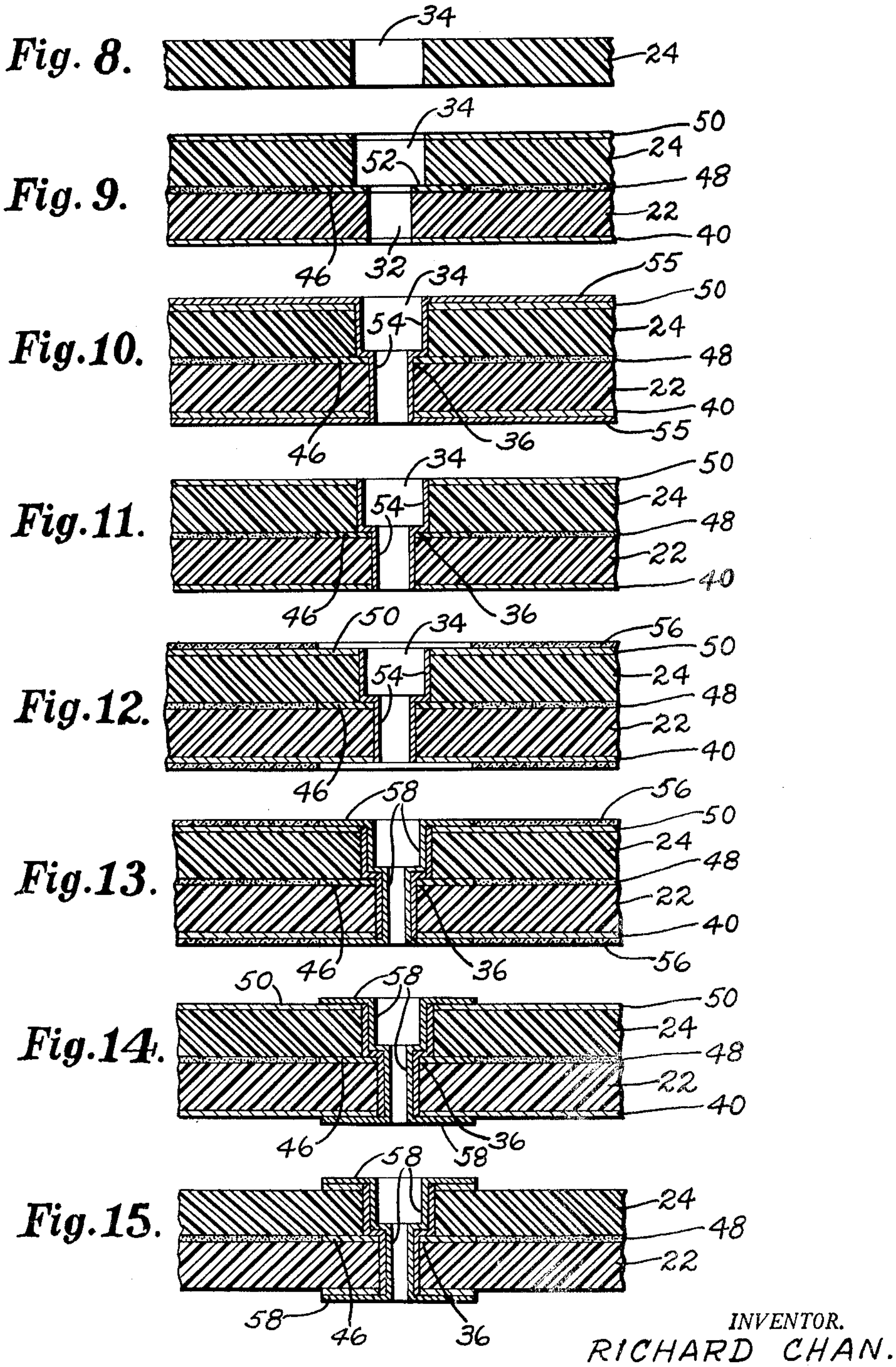

Other objects of the invention will become apparent from the following description taken in connection with the accompanying drawings, in which:

FIG. 1 is a fragmentary perspective view of a laminated circuit board constructed in accordance with my improved method;

FIGS. 2 to 7 inclusive, are fragmentary sectional views illustrating certain steps of my method that are successively performed on one of a pair of laminae;

FIG. 8 is a fragmentary sectional view of another lamina of the circuit mounting board, and FIGS. 9 to 15 inclusive are fragmentary sectional views of the laminae bonded together and illustrating the method steps progressing to the completion of the electrical unit.

Referring to the drawings by characters of reference, FIG. 1 illustrates a multiple circuit mounting board constructed in accordance with the invention, the board being a lamination that may comprise any desired number of laminae. For purposes of simplicity, the board 20 is illustrated as comprising two laminae 22 and 24 bonded flat together with a circuit 26 between the opposed laminae surfaces and circuits 28 and 30 mounted respectively on the outer or opposite surfaces of the laminae. Each of the laminae 22 and 24 are respectively provided with one or more holes 32 and 34 therethrough for extension through the board of electrical connections between the circuits 26, 28 and 30 at terminals of the circuits and for receiving electronic components (not shown) of the circuits. As shown, for example in FIG. 9, the diameter of the hole 32 in lamina 22 is less than the diameter of the hole 34 in lamina 24, and preparatory to bonding the laminae together, the holes are substantially axially aligned whereby an internal shoulder 36 is provided between the outer surfaces of the board for a purpose hereinafter described.

Figure 5:
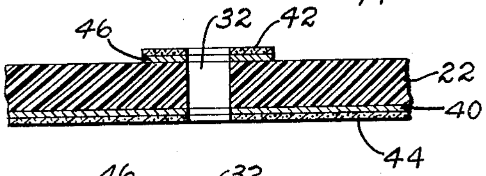
Figure 6:
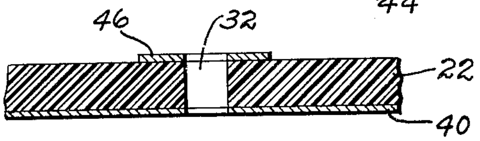
Figure 7:
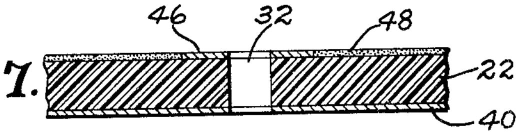

The laminae 22 and 24 may be of any suitable dielectric material, such as a thermo-setting plastic material, or synthetic resin. The first step of the method consists of providing the above mentioned holes 32 and 34 respectively in the laminae 22, 24 after which one of the laminae, illustrated as lamina 22, has a pair of electric conducting metallic sheets 38 and 40 or copper foil, affixed respectively to and flat against opposite side faces thereof, such as by any of the well known suitable adhesives, or cements. If desired, the foil 38 and foil 40 may first be bonded to the lamina 22 and the holes 32 and 34 then punched or otherwise provided in the lamina. An etchant resist, preferably in the form of a tacky ink, is applied by the negative screen process onto the copper foil 38 in the pattern of the desired circuit 26, including an annular pattern 42 of a terminal that is to extend about the adjacent end of the hole 32. The resist may comprise any one of the well known materials for this purpose, such as, a non-conductive acid resisting lacquer or paint, porcelain, rubber or some types of plastic material. The surface of the other foil 40 is completely covered by the resist, as indicated at 44, in FIGS. 4 and 5 to protect the copper foil from a subsequent acid etching process. The lamina 22 is now subjected to the etching process or etchant bath, such as ferric chloride, which strips away the unwanted field of the foil 38, leaving copper in the configuration of the desired circuit 26 on one face of the lamina and including an annular terminal 46, as illustrated in FIG. 5. The acid resist 42 and 44 is then washed away or otherwise removed from both the copper foil circuit and from the foil 40 following which a layer of adhesive or cement 48, as shown in FIG. 7, is applied, such as by the positive printing screen process, to the stripped surface of the lamina 22. Next, a sheet of copper foil 50 is affixed by adhesive to one side face of the other lamina 24 and the laminae 22 and 24 are then bonded together under pressure with the circuit 26 therebetween and with the holes 32 and 34 substantially in axial alignment. As shown in FIG. 9, an inner margin 52 of the terminal 46 is exposed and projects into the larger hole 34 of the board lamina 24 for a purpose hereinafter described.

The next step of the method is to subject the laminated board to an electrolytic copper plating process. During this process, plated bridges of copper 54 are built up between the inner margin 52 of the terminal 46 and the copper foil sheets at and surrounding opposite ends of the holes, thus effecting so-called plated through holes in the board for electrically connecting the terminal 46 to both of the copper foil sheets 40 and 50. The plating process also copper plates, as at 55, the outer surfaces of the copper foil sheets with unwanted copper, as shown in FIG. 10, the plating being removed in the next step of the method, such as by a sanding or buffing operation. Following the removal of the unwanted copper plating 55, a solder resist 56 is applied to both of the outer surfaces of the copper foils 40 and 50, such as by the positive silk screen printing process, as illustrated in FIGS. 12 and 13, to provide patterns of the circuits desired on the outer sides of the board. The board is then dip soldered to tin the exposed copper patterns, as at 58, and also to tin the copper bridges 54 throughout the holes, including the copper plated land 52. Following the dip soldering step, the resist is washed away or otherwise removed, FIG. 14, and then the board is subjected to an acid bath which etches away the unwanted copper or fields of the foil sheets 40 and 50 leaving tinned copper circuits on the outer side surfaces of the board, as illustrated by FIG. 15.

It will be appreciated that by the above described method, an electrical unit may be made having a circuit between two bonded together laminae and circuits on the outer faces of the laminated board, and the circuits electrically connected together by the plated through conductor bridges in the holes. This method of construction provides a tubular or sleeve-like conductor in the laminated board that is integral with the three terminals of the circuits to provide good electrical connection therebetween.

While I have shown and described the invention in considerable detail, it will be understood that many variations may be provided therein without departing from the spirit and scope of the invention.

What is claimed is:

1. The method of making an electrical unit including a plurality of circuits on a laminated mounting board comprising the steps of affixing a pair of circuit terminals respectively to the opposite sides of a dielectric lamina around the opposite ends of a hole in the lamina, affixing a circuit terminal to one side only of a second lamina around a hole in the second lamina larger in diameter than the hole in the first lamina, bonding the laminae flat together with one of the terminals of the first lamina against the other side of the second lamina and with the holes substantially aligned so that an inner margin of the intermediate terminal is exposed as a land between the holes, and thereafter electro-plating the terminals to form conducting bridges between the land of the intermediate terminal and the outer terminals.

2. The method of making an electrical unit including a plurality of circuits on a laminated mounting board comprising the steps of affixing a pair of circuit terminals respectively to the opposite sides of a dielectric lamina around the opposite ends of a hole in the lamina, affixing a circuit terminal to one side only of a second lamina around a hole in the second lamina larger than the hole in the first lamina, bonding the laminae flat together with one of the terminals of the first lamina against the other side of the second lamina and with the holes substantially aligned so that an inner margin of the intermediate terminal is exposed as a land between the holes, electroplating the terminals to form conducting bridges between the land of the intermediate terminal and the outer terminals, and thereafter removing the plating from the faces of the outer terminals.

3. The method of making an electrical unit including a plurality of circuits on a laminated mounting board comprising the steps of affixing a pair of circuit terminals respectively to the opposite sides of a dielectric lamina around the opposite ends of a hole in the lamina, affixing a circuit terminal to one side only of a second lamina around a hole in the second lamina larger than the hole in the first lamina, bonding the laminae flat together with one of the terminals of the first lamina against the other side of the second lamina and with the holes substantially aligned so that an inner margin of the intermediate terminal is exposed as a land between the holes, electroplating the terminals to form conducting bridges between the land of the intermediate terminal and the outer terminals, removing the plating from the faces of the terminals, and then solder plating the faces of the outer terminals.

4. The method of making a plurality of terminally connected circuits and insulating mounting board therefor comprising the steps of forming a dielectric board lamina having a hole therethrough, forming a second dielectric board lamina having a hole therethrough larger than the hole in the first lamina, affixing metallic circuits respectively to opposite sides of one of the lamina including terminal portions around the hole of the one lamina, affixing a circuit to one side only of the other lamina including a terminal portion around the hole in the other lamina, bonding the laminae together and with one of the circuits of the first lamina flat against the other side of the second lamina and with the holes substantially aligned so as to provide an internal shoulder faced with an inner margin of the terminal portion of the intermediate circuit, and thereafter connecting the circuits together at the holes by forming electric conducting bridges between the inner margin of the terminal portion and the terminal portions of the outer circuits.

5. The method of making an electrical unit including a plurality of circuits electrically connected together on a mounting board comprising the steps of forming a dielectric board lamina having a hole therethrough, forming a second dielectric board lamina having a hole therethrough larger than the hole in the first lamina, affixing metallic circuits to opposite sides of one of the laminae and including annular terminal portions surrounding and extending to the hole in the one lamina, affixing a metallic circuit to one side of the other lamina including an annular terminal portion surrounding and extending to the hole in the said other lamina, bonding the laminae together with the circuits spaced apart by the laminae and the holes substantially aligned so that an inner margin of the terminal portion of the intermediate circuit projects into the larger hole, and thereafter plating metallic bridges between the inner margin of the terminal portion of the intermediate circuit and the terminal portions of the outer circuits.

6. The method of making an electrical unit including a plurality of circuits connected together and mounted on a laminated dielectric mounting board comprising the steps of forming a dielectric lamina having a hole therethrough, affixing a metallic circuit to one side of the lamina including a terminal portion at the hole, forming a second lamina having a hole therethrough of a different size than the hole in the first lamina, bonding the laminae flat together with the circuit therebetween and with the holes aligned so that an inner margin of the terminal portion projects into the larger of the holes, affixing metallic circuits respectively to the outer surfaces of the laminae including terminal portions at both holes, and thereafter plating conducting bridges between the marginal projecting portion of the intermediate terminal portion to the outer terminal portions.

7. The method of making an electrical unit including a plurality of electrically connected circuits on a laminated dielectric mounting board comprising the steps of forming a dielectric lamina having a hole therethrough, affixing a metallic circuit to one side of the lamina and including an annular terminal extending to and around the hole, forming a second dielectric lamina having a hole therethrough larger than the hole through the first lamina, bonding the laminae together broadside with the holes substantially aligned such than an inner margin of the terminal portion forms a land between the holes, affixing circuits respectively to the outer faces of the laminae including terminal portions around and extending to the holes, applying an electro-plating resist to the outer circuits excluding the terminal portions, electro-plating the terminal portions with copper, forming copper bridges spanning the land and the outer terminal portions of the outer circuits, and thereafter removing the resist.

8. The method of making an electrical unit including a plurality of electrically connected circuits on a laminated dielectric mounting board comprising the steps of forming a dielectric lamina having a hole therethrough, affixing a sheet of electric conductive foil to one side of the lamina, applying an acid resist to the outer surface of the foil in a pattern of the desired circuit including an annular terminal portion around the hole, etching away the field of the foil, removing the resist, forming a second dielectric lamina having a hole therethrough larger than the hole in the first lamina, bonding the laminae together with the circuit therebetween and the holes substantially aligned such that an inner margin of the terminal portion provides a land between opposite sides of the laminae, affixing copper foil to opposite sides of the laminae, subjecting the board to an electro-copper plating process to form copper bridges spanning the land and the copper foil, sanding off the copper plating from the outer faces of the copper foil, applying acid resist in the form of circuits on the outer surfaces of the copper foils and excluding annular areas around the holes, solder plating the bridges and areas around the holes, removing the resist, and then etching away the fields of the copper foils.

9. An electrical unit comprising, a pair of laminae bonded flat together and each having a hole therethrough of different diameter and substantially aligned to form an internal shoulder, a circuit between the opposed faces of the laminae including a terminal having an inner annular margin projecting into the larger of said holes and supported on said shoulder, a pair of circuits affixed respectively to the outer surfaces of said laminae and each including an annular terminal respectively surrounding the outer ends of the holes, and a tubular conductor extending through the holes of both of said laminae and integrally connected to the margin of the intermediate terminal and to the outer terminals.

10. An electrical unit comprising, a pair of flatly bonded together laminae, one of said lamina having a hole therethrough substantially aligned with a larger hole in the other lamina to form an internal shoulder, an electric circuit disposed between said laminae including an annular terminal having an inner margin thereof projecting into the larger hole and supported on the shoulder, a pair of electric circuits respectively affixed to the outer sides of said laminae including annular terminals around opposite ends of the holes, and an electric conducting sleeve extending through and complementary to the holes and shoulder and integrally connected to said margin of the intermediate terminal and to the terminals of the outer circuits.

References Cited in the file of this patent

UNITED STATES PATENTS

| | | |
|---|---|---|
| 2,848,359 | Talmey | Aug. 19, 1958 |
| 2,872,391 | Hauser et al. | Feb. 3, 1959 |
| 2,912,747 | Oshry et al. | Nov. 17, 1959 |
| 2,937,358 | Bulger | May 17, 1960 |